PULSE DISCRIMINATING LATCH

Filed Jan. 13, 1966

INVENTORS
HOWARD H. NICK
MURRAY H. BOLT
BY W. G. Robertson
ATTORNEY

United States Patent Office 3,444,470

Patented May 13, 1969

3,444,470

PULSE DISCRIMINATING LATCH

Murray H. Bolt and Howard H. Nick, Poughkeepsie, N.Y., assignors to International Business Machines Corporation, Armonk, N.Y., a corporation of New York Filed Jan. 13, 1966, Ser. No. 520,334
Int. Cl. H03k 5/20
U.S. Cl. 328—109 8 Claims

ABSTRACT OF THE DISCLOSURE

This disclosure teaches an improved pulse discriminating latch, a sequential circuit having a plurality of input terminals and output terminals and operable in response to a signal at an input terminal to produce a signal at the corresponding output terminal and to become nonresponsive to any subsequent pulses. This invention provides improved timing so that the circuit can discriminate between two pulses that are as close together as one-half the delay of the logic circuits that make up the pulse discriminating latch.

INTRODUCTION

A latch is a circuit that has two output states usually called set and reset. A latch has two input terminals, called set and reset. In response to a pulse at one of the input terminals, the latch switches to the corresponding output condition and it holds this condition until it receives a pulse at the other input. A pulse discriminating latch is essentially two latches that are interconnected so that the first latch to set holds the other latch at a reset condition. Such a circuit is useful for indicating which of two lines first received a signal.

OBJECTS

A general object of this invention is to provide a new and improved pulse discriminating latch. A more specific object is to provide a pulse discriminating latch that distinguishes between pulses that are very close together. A description of the problems of discriminating between closely spaced pulses will be helpful in understanding these objects.

If the two input pulses appear at exactly the same time, a pulse discriminating latch can not distinguish between the two pulses. In fact, in known pulse discriminating latches the two pulses must be separated by at least the delay of the logic blocks that make up the circuit. A logic block is a functional circuit unit having input and output terminals; a signal at an input terminal produces a change in the output only after a delay. Similarly the circuit requires that the input pulses be at least as wide as the delay. The next paragraphs in this section will explain the effect of these delays in two different pulse discriminating latches.

In the simple pulse discriminating latch already introduced, the first latch to receive a pulse would, after the circuit delay, produce an output that is available to inhibit a set pulse applied to the other latch. Whenever a second input pulse arrives at the other latch during the delay while the first latch turns on, the second input pulse and the inhibiting pulse will overlap. In this situation the circuit may oscillate or otherwise give an output that does not tell which pulse arrived first. Thus such a circuit can not distinguish between pulses that are closer together than the delay of the circuit blocks.

To avoid the delays associated with turning on the latches, it is possible to derive the inhibiting pulses from the input terminals rather than from the output terminals. In such a circuit the first pulse to arrive would propagate along one path to set one latch and would also propagate along another path to inhibit the other latch. Such an inhibit pulse would of course reach the other latch before any later signal at the other input terminal. With this circuit also, input pulses must be spaced apart by at least the delay of the circuit blocks. When the pulses are closer, the later input pulse produces an inhibit signal before the circuit has responded to the first arriving pulse.

Circuits of the type just described can be made to discriminate between more closely spaced pulses by providing faster circuit blocks. An object of this invention is to provide a pulse discriminating latch that discriminates between pulses that are spaced closer together than the circuit delays.

INTRODUCTION TO THE INVENTION

The circuit of this invention uses the forward inhibit path from the circuit input terminals that has been described. The circuit includes in each forward inhibit path a delay that is a fraction of the delay of the logic blocks. With this delay the circuit can discriminate between input pulses that are as close together as one half the circuit delay. The circuit also includes a reverse inhibit path from the latch outputs to maintain the inhibit condition until the circuit is reset from an external signal source.

A more general statement of the invention will be presented later.

The foregoing and other objects, features and advantages of the invention will be apparent from the following more particular description of a preferred embodiment of the invention, as illustrated in the accompanying drawings.

THE DRAWING

INTRODUCTION TO THE CIRCUIT

Figures 1, 2:
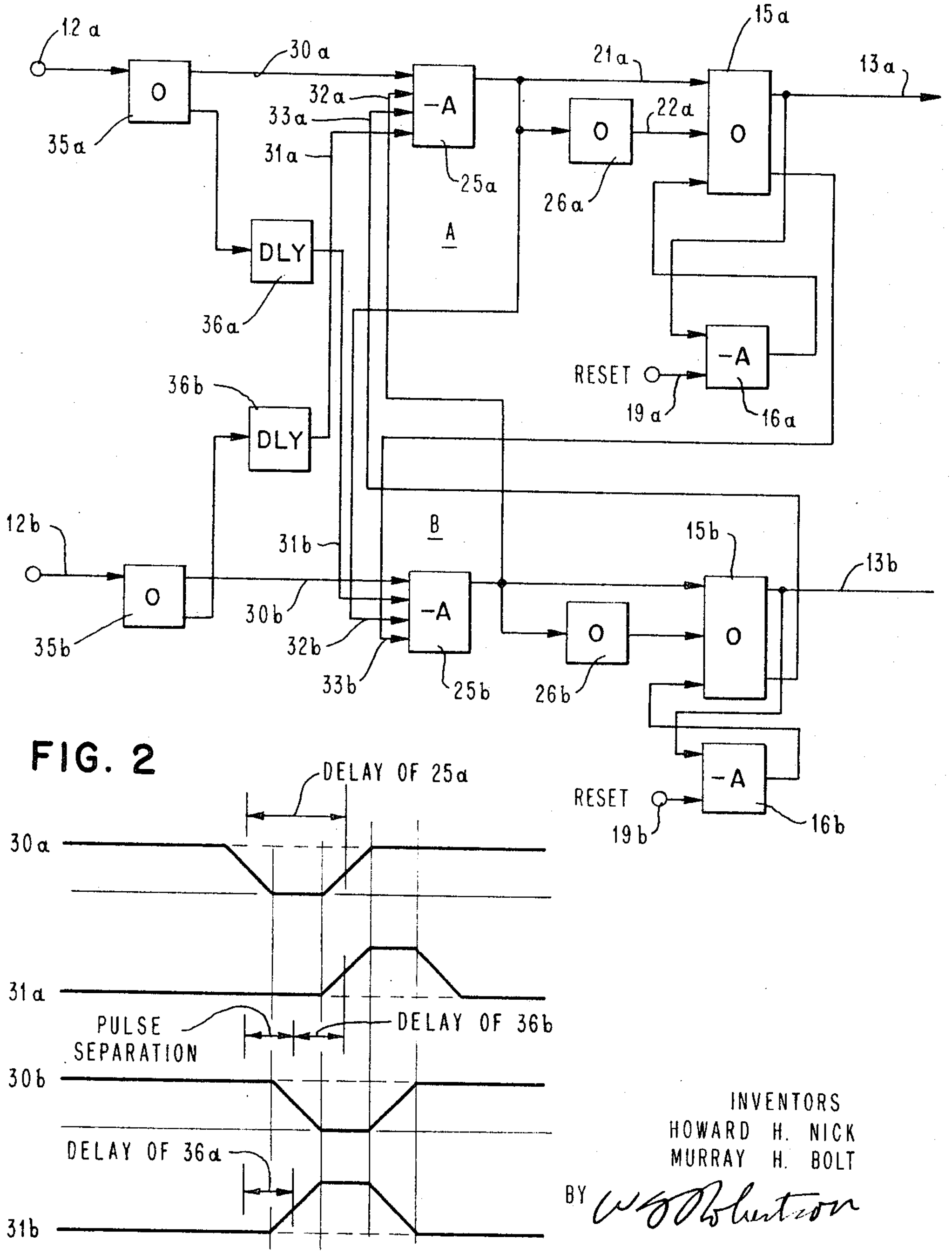
FIG. 1 is a schematic of the preferred embodiment of the invention.
FIG. 2 is a series of wave forms that show the relationship between delays in the circuit and the minimum detectable separation between input pulses.

The circuit has two similar groups of components that are designated A and B in the drawing. Corresponding components in each group have the same identifying number with the distinguishing subscript *a* or *b*. The numbers without subscripts will be used in this description where similar components are referred to collectively or interchangeably, and the subscripts will be used to distinguish a particular component from its counterpart in the other group.

The circuit of the drawing is made up of logic blocks that form the OR logic function and its complement, —AND (equivalently called OR invert). Preferably, the logic blocks represent current switch logic circuits of the type disclosed in U.S. Patent 2,964,654 to H. S. Yourke. When a single output is used, the function is identified in the drawing as OR or —A; where both outputs are used, the upper line in the drawing is the complement output and the lower line is the OR output. Certain OR circuits are used only to provide the true and complement outputs 35 or to provide a time delay 26 and have single inputs.

Each circuit group has an input terminal 12 and an output terminal 13. Each group includes a latch that is connected to control the associated output terminal. The latches are each illustrated as a conventional interconnection of the input terminals and the complement output terminals of two logic blocks 15 and 16. Block 15 has its complement output (arbitrarily) connected to control circuit output terminal 13. One input terminal 19 of block 16 is connectable to receive an externally generated signal for resetting the latch. Two input terminals 21, 22 (as explained later) of block 15 form a set input.

A logic block 25 is connected to set the latch. The connection between the output terminal of block 25 and the latch includes a pulse widener. Preferably the pulse widener comprises a direct connection to input terminal 21 and a connection to input 22 through a logic block 26 that produces the same delay as the other logic blocks of the circuit. The consecutive pulses that appear on lines 21, 22 have the effect of a single wide pulse. The widened pulse corresponds to the delay through blocks 15 and 16 before the output of block 16 appears at input of block 15. Block 25 has an input 30 that is connected to receive a set signal, and it has inputs 31, 32 and 33 that are connected to receive inhibiting signals. (Block 25 performs the same —AND function on all its inputs.) The inhibiting interconnections of the logic blocks will be described later.

A logic block 35 is connected to receive the circuit input and to produce this signal at its lower output terminal (after a delay) and the complement at its upper output terminal. From a more general standpoint, block 35 can be thought of as being external to the pulse discriminating latch since the signal and its complement may both be available in some applications.

The complement output of block 35 is connected to the set input 30 of the associated block 25. A delay device 36 connects the true output of block 35 to inhibit the other circuit group. Except for the inhibiting inputs to block 25, a pulse that appears at either input terminal **12*a* or 12*b* would propagate through the associated blocks 35, 33 and 21 and appear at the associated output terminal 13. The three inhibiting paths to each block 25** will be described next.

FIG. 2 shows wave forms that illustrate the relationship between set and inhibit pulses at inputs 30 and 31. The wave forms are identified in the drawing by the number of the corresponding line in FIG. 1. Delays and separations between pulses are measured from points on the rising or falling edges of the waveforms where the pulse has half its maximum amplitude. Light horizontal lines indicate zero levels. The pulses on lines **30*a* and 30*b* are equivalent to the input pulses at terminals 12*a* and 12*b* since the delays through blocks 35*a* and 35*b*** are equal.

FIG. 2 shows the operation when a pulse at terminal **12*a* precedes a pulse at terminal 12*b* by the minimum separation that the circuit can distinguish. This separation is one half the delay of block 25*a*. This separation is established by the relationship between the pairs of inputs 30*a* and 31*a*, 30*b* and 31*b*, and 31*a* and 31*b***, as will be explained next.

To operate circuit block **25*a*, the set pulse on line 30*a* must fully precede the inhibit pulse on line 31*a*. As FIG. 2 shows, the trailing edge of the set pulse coincides with the leading edge of the inhibit pulse. Stated from a different standpoint, the inhibit pulse on line 31*a* is delayed with respect to the set pulse on line 30*a* by the delay of circuit block 25*a*. Part of this delay is provided by delay device 36*b*; the rest of the delay must be provided by the separation between the pulses at the input terminals 12*a* and 12*b***.

To inhibit block **25*b* the inhibit pulse on line 31*b* must be at least early enough to coincide with the set pulse on line 30*b*. As FIG. 2 shows, the pulses on lines 30*a* and 30*b*** are identical in time and opposite in level.

The relationship between the pulses of FIG. 2 is further defined by the fact that in the usual application for the circuit, the delays of devices **36*a* and 36*b* are made equal and the delays of circuit blocks 25*a* and 25*b* are made equal. A FIG. 2 shows, these relationships are met when the delay of device 36 is one half the delay of circuit block 25 and the pulses at the input terminals 12*a* and 12*b* are separated by at least one half the delay of a circuit block 25**.

Inputs **32*b* and 33*b* continue the inhibit after the trailing edge of the pulse on line 31*b*. Since the inhibit pulses at input 31*b* begin later than the set pulse on line 30*a* and the inhibit pulse is as wide as the set pulse, the trailing edge of the inhibit pulse on line 31*b* is overlapped by the output of block 25*a*. The output of each block 25 is connected to the inhibit input 32** of the other circuit group to maintain the inhibit condition as the set pulse progagates through the circuit.

The leading edge of the output of block **15*a* coincides with the trailing edge of the output pulse of block 25*a*. A connection from the true output of each block 15 to the input 33** of the other circuit group maintains the inhibit condition until the circuit is reset.

OTHER EMBODIMENTS

The analysis just presented can be extended to circuits with more than two latches and more than two input terminals by providing a similar circuit group for each pair of input and output terminals and providing the connections of the drawing between each of the circuit groups. It is also possible by adding circuitry at the input or the outputs or by varying the delays of the delay device 40 and of the other circuit components to make the circuit respond to a particular sequence of inputs rather than to a single first input.

The latch that has been described specifically is in effect a three state device (one or the other or neither of the latches indicating a pulse) and the two discrete latches of the drawing can be replaced by various circuits that provide three stable states. Thus from a more general standpoint, the group of two or more latches form a particular kind of sequential circuit. Other variations in circuit detail will be apparent to those skilled in the art.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A pulse discriminating latch for receiving pulses at a plurality of input terminals and indicating which of the input terminals first received a pulse, comprising:

a sequential circuit having a plurality of stable states and connected to be responsive to a pulse of a predetermined minimum width at any one of said input terminals to switch to a predetermined stable state signifying that a pulse has occurred at said one input termial, said sequential circuit including, for each of said stable states signifying an input pulse, an inhibit input connection and in response to a pulse at any inhibit input connection being inhibited from switching to the corresponding stable state, and means connecting each input terminal to every other inhibit input connection, said means including a time delay equal to one half said predetermined minimum width, whereby the latch discriminates between first and second occurring input pulses that are separated by at least said time delay.

2. A pulse discriminating latch according to claim 1 in which the sequential circuit has a number of output terminals equal to the number of input terminals.

3. A pulse discriminating latch according to claim 2 in which there are two input terminals and two output terminals and said sequential circuit has at least three stable states signifying the occurrence of a pulse at one of said input terminals, at the other of said input terminals and the non-occurrence of a pulse at either of said input terminals.

4. A pulse discriminating latch according to claim 2 in which there is a discrete latch for each pair of corresponding input and output terminals.

5. A pulse discriminating latch according to claim 4 including for each said discrete latch a first logic block connected to set its associated latch in response to a signal from the corresponding input terminal and to receive the delayed inhibit signal from the other input terminal.

6. A pulse discriminating latch according to claim 5 in which there is only one input terminal for each logic variable that the circuit is to operate on and the pulse discriminating latch further includes a second logic block for each variable connected to an associated input terminal to provide both the true and the complement of the input variable and having one phase of its output connected to supply a set pulse to an input of the associated first logic block and having the opposite phase connected to the delay means of the other of said first logic blocks.

7. A pulse discriminating latch according to claim 6 in which each said time delay means has an equal delay.

8. A circuit of the type having input-output terminal pairs and having latch means connected to control each output terminal and logic blocks having a predetermined delay and individual to an input-output terminal pair for receiving an input pulse and setting said latch means to produce a signal at the corresponding output terminal to signify the occurrence of said input pulse, wherein the improvement comprises:

for each input terminal, time delay means connected to apply a pulse to inhibit transmitting further pulses to said latch means to the logic block of every other input terminal at a time later by one-half said predetermined delay than the time said pulse is applied to its corresponding logic block, whereby the circuit discriminates between first and second occurring input pulses that are separated by at least one-half said delay.

References Cited

UNITED STATES PATENTS

| | | | |
|---|---|---|---|
| 2,636,133 | 4/1963 | Hussey | 307—216 |
| 3,268,743 | 8/1966 | Nourney | 307—232 |

ARTHUR GAUSS, *Primary Examiner.*

B. P. DAVIS, *Assistant Examiner.*

U.S. Cl. X.R.

307—232